(12) United States Patent
Sugino

(10) Patent No.: US 11,114,217 B2
(45) Date of Patent: Sep. 7, 2021

(54) SHIELD CONDUCTION PATH

(71) Applicant: SUMITOMO WIRING SYSTEMS, LTD., Yokkaichi (JP)

(72) Inventor: Hidetoshi Sugino, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 41 days.

(21) Appl. No.: 16/472,320

(22) PCT Filed: Dec. 25, 2017

(86) PCT No.: PCT/JP2017/046344
§ 371 (c)(1),
(2) Date: Jun. 21, 2019

(87) PCT Pub. No.: WO2018/131448
PCT Pub. Date: Jul. 19, 2018

(65) Prior Publication Data
US 2020/0350097 A1    Nov. 5, 2020

(30) Foreign Application Priority Data
Jan. 12, 2017    (JP) .............................. JP2017-003226

(51) Int. Cl.
*H01B 7/20*    (2006.01)
*H01B 7/18*    (2006.01)
(Continued)

(52) U.S. Cl.
CPC ............... *H01B 7/20* (2013.01); *H01B 7/185* (2013.01); *H02G 3/04* (2013.01); *H05K 9/00* (2013.01)

(58) Field of Classification Search
CPC .......... H02G 1/06; H02G 3/04; H02G 3/0406; H02G 9/06; H01B 7/20; H01B 7/185
(Continued)

(56) References Cited

U.S. PATENT DOCUMENTS 6,476,327 B1 * 11/2002 Bernard ................ H02G 3/045
174/101
6,972,367 B2 * 12/2005 Federspiel ........... H02G 3/0418
174/481
(Continued)

FOREIGN PATENT DOCUMENTS

JP    07-245858 A  *  9/1995 ............... H02G 9/04
JP    2004-171952 A    6/2004
(Continued)

OTHER PUBLICATIONS

Jan. 23, 2018 International Search Report issued in International Patent Application No. PCT/JP2017/046344.

*Primary Examiner* — William H. Mayo, III
(74) *Attorney, Agent, or Firm* — Oliff PLC

(57) ABSTRACT

A shield conduction path that includes a wire; and a pipe with a circular cross-section that accommodates the wire. The pipe is formed by combining a first divided body and a second divided body that are divided in a diameter direction using, as boundaries, divided surfaces that extend in an axial direction of the pipe. The first divided body and the second divided body include a metal material that can be held in a combined state through welding, and a circumferential length of the first divided body is set to be longer than a circumferential length of the second divided body.

8 Claims, 4 Drawing Sheets

(51) Int. Cl.
*H02G 3/04* (2006.01)
*H05K 9/00* (2006.01)

(58) Field of Classification Search
USPC .............................. 174/36, 84 R, 8 R, 92, 93
See application file for complete search history.

(56) References Cited

U.S. PATENT DOCUMENTS

| | | | |
|---|---|---|---|
| 7,411,126 B2* | 8/2008 | Herzog | H02G 3/0418 |
| | | | 174/135 |
| 2004/0099427 A1 | 5/2004 | Kihira | |
| 2015/0250079 A1* | 9/2015 | Sugino | H05K 9/0098 |
| | | | 174/372 |
| 2015/0334882 A1* | 11/2015 | Sugino | H02G 3/0481 |
| | | | 174/377 |
| 2018/0326927 A1* | 11/2018 | Ujita | H02G 3/0406 |

FOREIGN PATENT DOCUMENTS

| | | | | |
|---|---|---|---|---|
| JP | 2004-257455 A | * | 9/2004 | ............ H02G 3/04 |
| JP | 2004-257455 A | | 9/2004 | |
| JP | 2006-271140 A | * | 10/2006 | ............ H02G 1/06 |
| JP | 2009-55740 A | * | 3/2009 | ............ H02G 3/04 |

* cited by examiner

SHIELD CONDUCTION PATH

This application is the U.S. National Phase of PCT/JP2017/046344 filed Dec. 25, 2017, which claims priority from JP 2017-003226 filed Jan. 12, 2017, the entire disclosure of which is incorporated herein by reference.

BACKGROUND

The present disclosure relates to a shield conduction path. JP 2004-171952A discloses a shield conduction path routed under the floor of an automobile. This shield conduction path includes a pipe made of metal and a wire inserted into the pipe, and the pipe includes both an electromagnetic shield function and a wire protection function.

SUMMARY

The above-described shield conduction path is used in the case of connecting an inverter apparatus in an engine compartment and a motor for driving a rear wheel, for example, but in this case, the routing length of the shield conduction path is a long length of 3 to 4 m. The task of inserting a wire into this long pipe is difficult because of frictional resistance between the wire and the inner circumference of the pipe, and the like.

An exemplary aspect of the disclosure improves workability when accommodating a wire in a pipe.

The present disclosure includes a shield conduction path that includes a wire; and a pipe with a circular cross-section that accommodates the wire, wherein the pipe is formed by combining a first divided body and a second divided body that are divided in a diameter direction using, as boundaries, divided surfaces that extend in an axial direction of the pipe, the first divided body and the second divided body include a metal material that can be held in a combined state through welding, and a circumferential length of the first divided body is set to be longer than a circumferential length of the second divided body.

Note that "circular" in the disclosure of the present application is defined as being a true circle, an oval, an ellipse, or a shape constituted by a curved line with an undefined curvature. Also, "welding" in the disclosure of the present application is defined as metalworking in which a first divided body and a second divided body are melted and integrated through application of a high temperature, pressure, or the like, and specific modes of welding include laser welding, brazing, TIG welding, and the like.

When the wire is to be accommodated in the pipe, the first divided body and the second divided body are separated, the wire is placed on the first divided body, the second divided body is placed thereon to combine the two divided bodies, and both divided bodies are fixed in the combined state through welding. With the shield conduction path of the present disclosure, the task of accommodating the wire in the pipe is easier compared to the case of inserting the wire in the axial direction into a pipe with a form that is closed over its entire circumference.

DETAILED DESCRIPTION OF EMBODIMENTS

Figure 1:
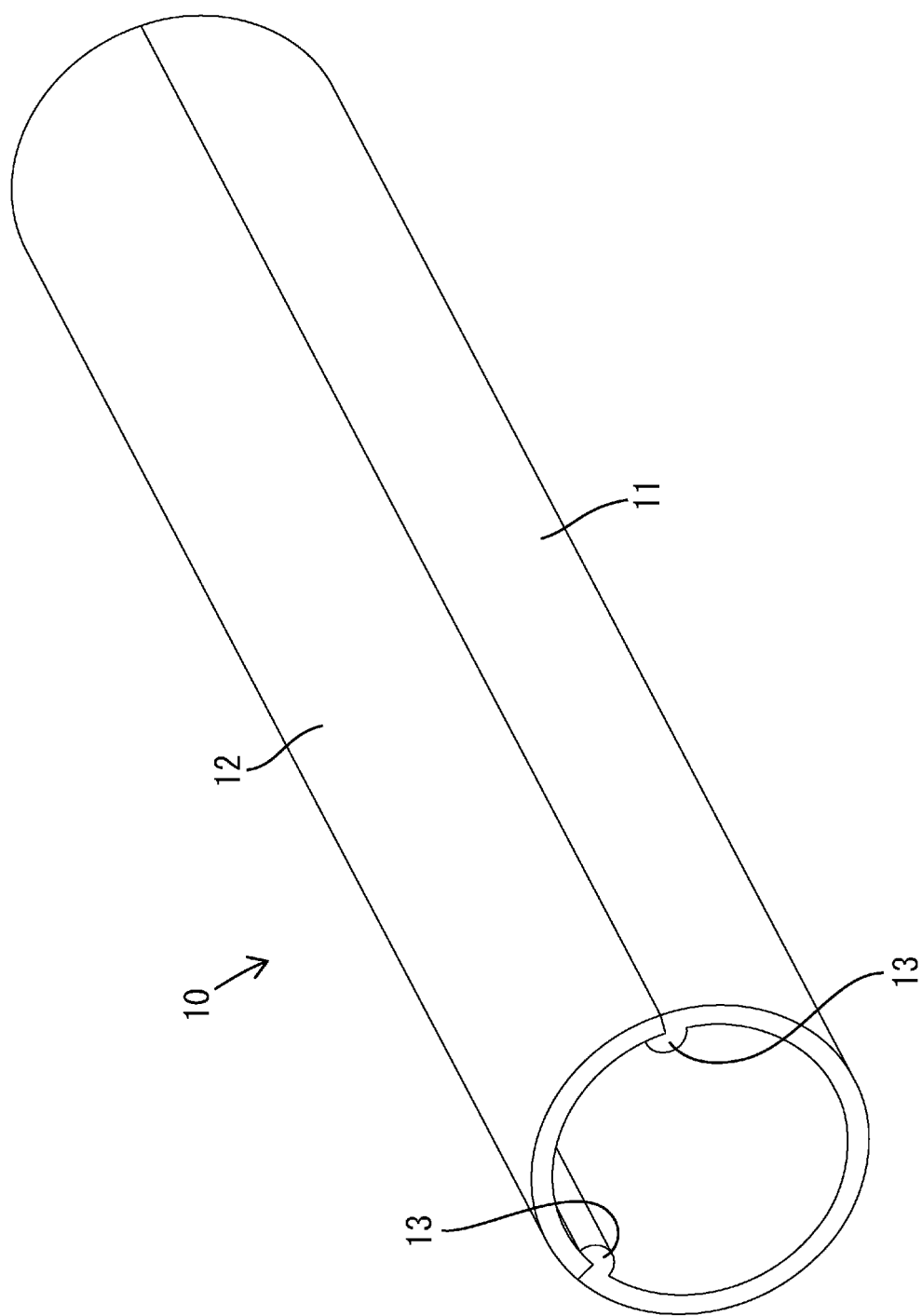
FIG. 1 is a perspective view of a pipe constituting a shield conduction path of Embodiment 1.
Figure 2:
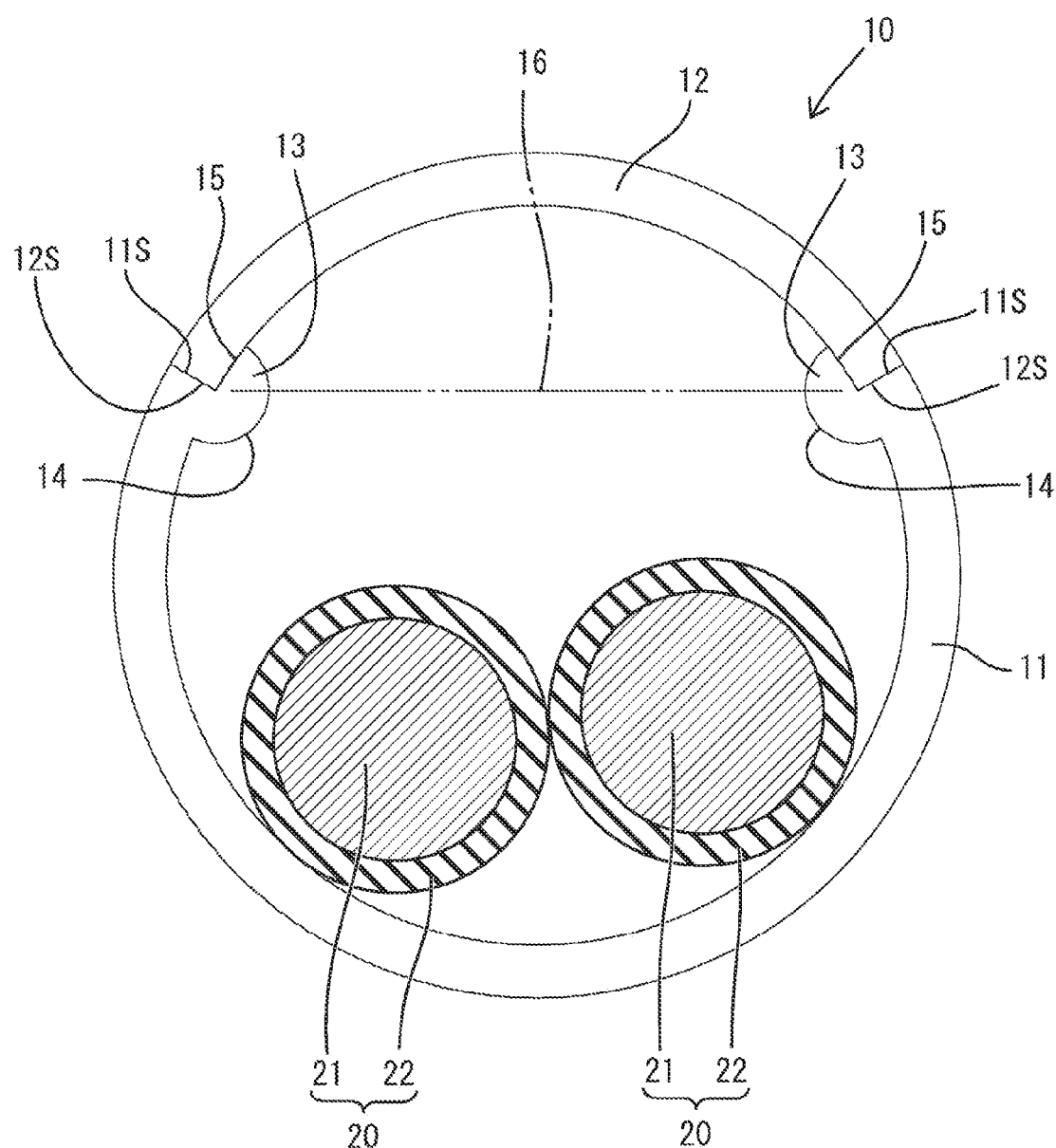
FIG. 2 is a front cross-sectional view of a shield conduction path.
Figure 3:
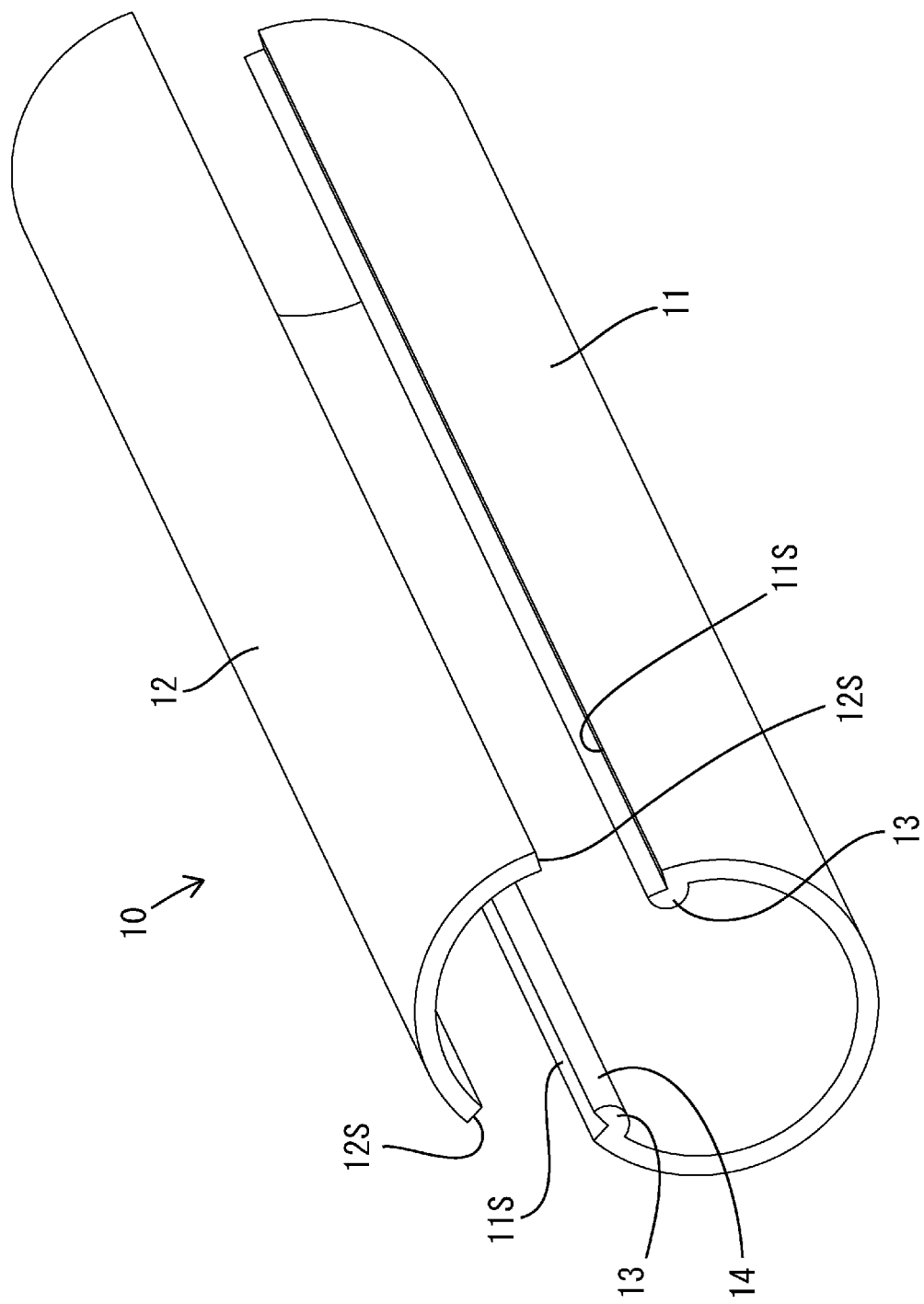
FIG. 3 is a schematic view of a pipe with a form that is divided into a first divided body and a second divided body.

In the present disclosure, the first divided body may have a form in which a virtual plane connecting the divided surfaces intersects with none of a plurality of the wires in a state in which the plurality of wires are accommodated in the first divided body. According to this configuration, as long as the opening surface of the first divided body faces upward, there is no risk that the wire will be brought close to the divided surface, and therefore even if the divided surface is heated during welding, there is no risk that the heat will be transmitted to the wire.

In the present disclosure, a blocking protrusion with a form that protrudes in a circumferential direction from an edge portion on an inner circumferential side of the divided surface may be formed on at least one of the first divided body and the second divided body. According to this configuration, the edge portion on the inner circumference side of the divided surface is covered by a blocking protrusion and does not face the inner circumference of the pipe, and therefore radiant heat is less likely to be radiated to the inside of the pipe when the divided surface is heated during welding.

In the present disclosure, a surface of the blocking protrusion that faces an inner portion of the pipe may be an arc-shaped surface. According to this configuration, there is no risk that the blocking protrusion will damage the wire, even if the wire interferes with the blocking protrusion.

In the present disclosure, on at least one of the first divided body and the second divided body, a pair of positioning portions that come into contact with a circumferential surface of the other divided body may be formed. According to this configuration, the first divided body and the second divided body can be temporarily held in a combined state by the pair of positioning portions.

Embodiment 1

Hereinafter, Embodiment 1, which is a specific example of the present disclosure, will be described with reference to FIGS. 1 to 4. Note that in the description hereinafter, regarding the up and down directions, the directions shown in FIGS. 1 to 4 are defined as upward and downward, as shown. Also, in the present embodiment, "cross section" is a surface obtained by cutting orthogonally to the axis (length direction) of pipe 10.

A shield conduction path of the present embodiment is routed under the floor of an electric automobile or hybrid automobile, and is used as a means of connecting an inverter apparatus in an engine compartment and a motor for driving a rear wheel, for example. The shield conduction path is constituted by including a pipe 10 that has an electromagnetic shield function and a wire protection function, and two wires 20 that are circular in cross section and are inserted into the pipe 10.

The pipe 10 is a member with a single-layer structure composed of a single metal material, such as aluminum or an aluminum alloy. The cross-sectional shape of the pipe 10 is a true circle on the outer circumferential portion, and is a true circle in a region of the inner circumference excluding ribs 13 (blocking protrusions and positioning portions). The thickness of the pipe 10 is constant, excluding the ribs 13.

The pipe 10 is composed of a first divided body 11 and a second divided body 12, which are divided in the diameter direction (up-down direction in FIGS. 2 and 4) using, as boundaries, first divided surfaces 11S and second divided surfaces 12S that are parallel to the axial direction. One pipe 10 is constituted by combining the first divided body 11 and the second divided body 12 in the diameter direction and integrating them through welding. In the present embodiment, welding is defined as metalworking in which the first divided body 11 and the second divided body 12 are welded and integrated through application of a high temperature, pressure, or the like. Specific modes of welding include laser welding, brazing, TIG welding, and the like.

The cross-sectional shape of the first divided body 11 is a circular arc shape with a longer circumferential length than a semicircle. The cross-sectional shape of the second divided body 12 is a circular arc shape with a shorter circumferential length than a semicircle. In a state in which the first divided body 11 and the second divided body 12 are combined, the pair of first divided surfaces 11S (divided surfaces) of the first divided body 11 and the pair of second divided surfaces 12S (divided surfaces) of the second divided body 12 come into contact in a surface contact state. Also, the first divided surface 11S and the second divided surface 12S are welded through welding, and thereby the first divided body 11 and the second divided body 12 are fixed and integrated in a combined state.

A pair of ribs 13 with forms that protrude in the circumferential direction from the inner circumferential edges of the pair of first divided surfaces 11S toward the second divided body 12 (upward in FIGS. 2 and 4) are formed on the first divided body 11. The pair of ribs 13 have a form in which regions of the inner circumference of the first divided body 11 that are adjacent to the first divided surface 11S are expanded. The cross-sectional shapes of the ribs 13 are approximately semicircular, and the surfaces of the ribs 13 that face the inner portion of the pipe 10 are arc-shaped surfaces 14 that have approximate semicircular arc shapes. The surfaces of the ribs 13 on the sides opposite to the arc-shaped surfaces 14 in the diameter direction are contact surfaces 15 with the same curvature as the inner circumferential surface of the second divided body 12. The contact surfaces 15 are approximately orthogonal to the first divided surface 11S.

A wire 20 is a conduction path with a known form in which a core wire 21 with a circular cross section is surrounded by a circular tube-shaped insulating coating 22. The outer diameter of the wire 20 is slightly smaller than half of the inner diameter of the pipe 10.

Figure 4:
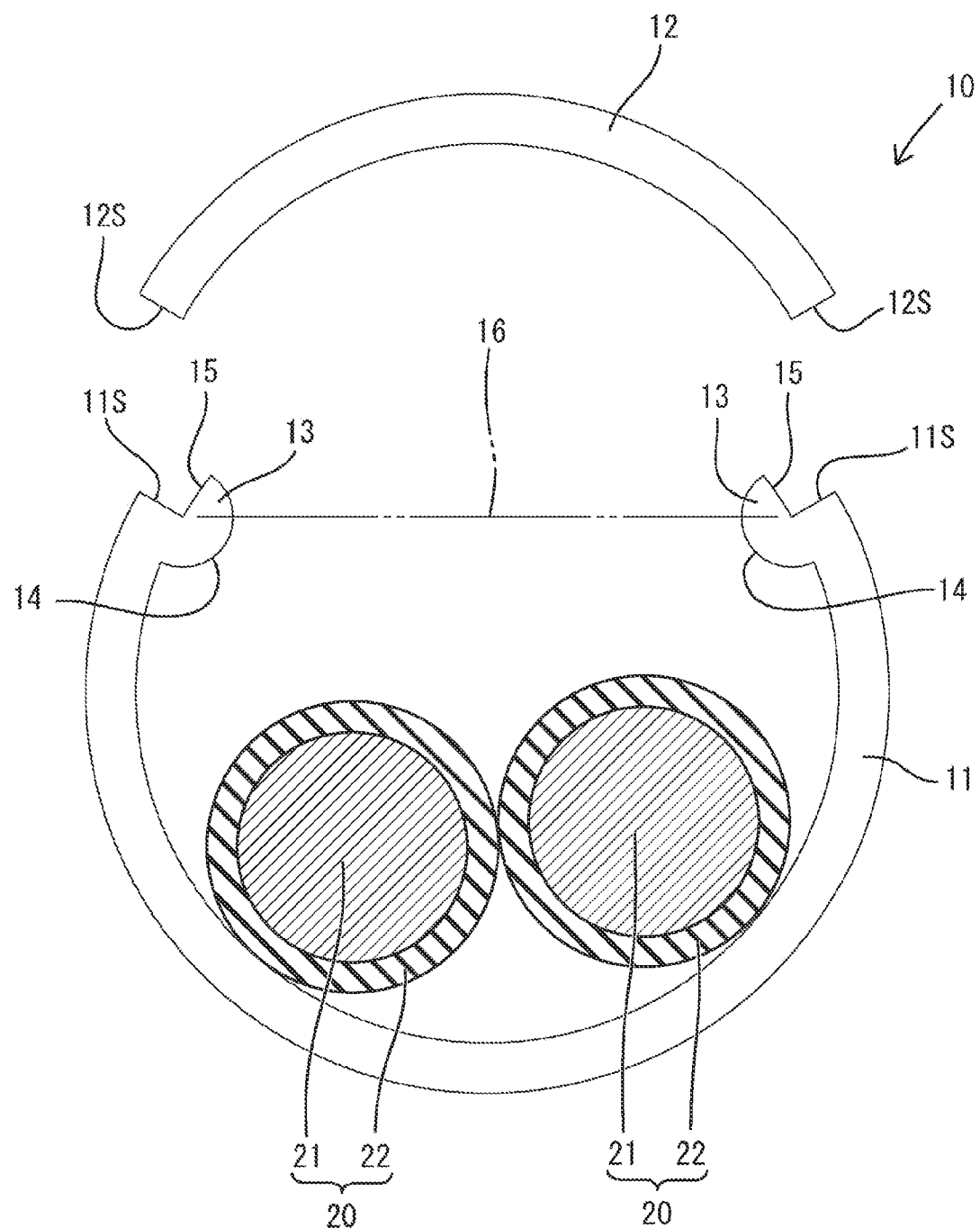
FIG. 4 is a front cross-sectional view of a shield conduction path, showing a form that is divided into a first divided body and a second divided body.

When two wires 20 are to be accommodated in the pipe 10, the first divided body 11 and the second divided body 12 are separated from each other, and the first divided body 11 is placed on a welding booth so as to be open upward. The two wires 20 are accommodated such that they fall into the first divided body 11 from above. The wires 20 do not need to be moved in the axial direction of the pipe 10, and therefore even if the pipe 10 and the wires 20 are long, workability is good. As shown in FIG. 4, the two wires 20 are accommodated in alignment in the left-right direction so as to be at approximately the same height. In this state, a virtual plane 16 connecting the pair of first divided surfaces 11S is at a position higher than the upper ends of the two wires 20, that is, at a height at which the two wires 20 are not crossed.

Thereafter, the second divided body 12 is combined with the first divided body 11 by being placed thereon from above. When combined, the pair of second divided surfaces 12S are placed on the first divided surfaces 11S, and come into contact therewith in a surface contact state. At the same time, the pair of ribs 13 located at the upper end portions of the first divided body 11 come into contact with the lower end portions of the inner circumferential surface of the second divided body 12. Since relative displacement of the second divided body 12 with respect to the first divided body 11 in the left-right direction is restricted by the ribs 13, the first divided surfaces 11S and the second divided surfaces 12S are positioned in a state of being in contact, and the first divided body 11 and the second divided body 12 are temporarily held in the correct combined state.

Thereafter, welding is performed with the temporary holding state maintained. In the welding step, the first divided surfaces 11S and the second divided surfaces 12S are heated, and therefore there is concern that the heat will be transmitted to the inner circumference of the pipe 10 and radiant heat will be transmitted to the wires 20. However, since the ribs 13 are arranged on the edge portion on the inner circumferential surface side of the first divided surfaces 11S so as to block the boundary surfaces of both divided surfaces 11S and 12S from the inner circumferential side, radiant heat generated during welding is not likely to be transmitted to the wires 20. When the welding step is complete, the first divided body 11 and the second divided body 12 are fixed in the combined state, and the shield conduction path in which two wires 20 are contained in an inserted state in the pipe 10 is complete.

As described above, the shield conduction path of the present embodiment includes two wires 20 and a pipe 10 with a circular cross section that accommodates the two wires 20. The pipe 10 is constituted by combining a first divided body 11 and a second divided body 12, which are divided in the diameter direction using, as boundaries, the divided surfaces 11S and 12S, which extend in the axial direction of the pipe 10. The first divided body 11 and the second divided body 12 include a metal material that can be held in a combined state through welding. Also, in the cross-section of the pipe 10, the circumferential length of the first divided body 11 is set to be longer than the circumferential length of the second divided body 12.

When the wire 20 is to be accommodated in the pipe 10, it is sufficient that the first divided body 11 and the second divided body 12 are separated from each other, the wire 20 is placed on the first divided body 11, the second divided body 12 is placed thereon to combine the divided bodies 11 and 12, and the divided bodies 11 and 12 are fixed in the combined state through welding. The task of accommodating the wire 20 in the pipe 10 is easier with the shield conduction path of the present embodiment, compared to the case where the wire 20 is inserted in the axial direction into the pipe 10 with a form that is closed over the entire circumference.

Also, the first divided body 11 has a form in which a virtual plane 16 that connects the first divided surfaces 11S intersects with neither of the two wires 20 in a state in which the two wires 20 are accommodated in the first divided body 11, and therefore there is no risk that the wires 20 will be close to the divided surfaces 11S and 12S, as long as the opening surface of the first divided body 11 faces upward. Accordingly, even if the divided surfaces are heated during welding, there is no risk that the heat will be transmitted to the wires 20.

Also, ribs 13 serving as blocking protrusions with forms that protrude in the circumferential direction from the edge portions on the inner circumferential sides of the first divided surfaces 11S are formed on the first divided body 11.

According to this configuration, the inner circumferential edges of the first divided surfaces 11S do not face the inner circumference of the pipe 10 since they are covered by the ribs 13. Accordingly, even if the divided surfaces 11S and 12S are heated during welding, radiant heat is not likely to be radiated to the inside of the pipe 10.

Also, the pair of ribs 13 come into contact with the inner circumferential surface of the second divided body 12 as positioning portions, and therefore the first divided body 11 and the second divided body 12 can be temporarily held in the combined state by the pair of ribs 13. Also, since the surfaces of the ribs 13 that face the inner portion of the pipe 10 are arc-shaped surfaces 14, there is no risk that the ribs 13 will damage the wires 20 even if the wires 20 interfere with the ribs 13 when the shield conduction path is bent or routed.

Other Embodiments

The present disclosure is not limited to the embodiment described above with reference to the drawings, and for example, the following embodiments are also encompassed in the technical scope of the present disclosure.

(1) In the above-described embodiment, a single-layer structure is used in which the pipe is composed of a single metal material, but the pipe may also have a multi-layered structure in which a circular cylindrical synthetic resin layer and a circular cylindrical metal layer are stacked concentrically. In one example of a pipe with a multi-layered structure, a three-layer structure is used in which a synthetic resin material is used for the inner layer and outer layer and a metal material is used for the intermediate layer.

(2) In the above-described embodiment, the cross-sectional shape of the pipe is a true circle, but the pipe may also have an oval shape, an elliptical shape, or a shape formed by a curved line with an undefined curvature.

(3) In the above-described embodiment, two wires were accommodated in one pipe, but the number of wires accommodated in one pipe may be 1, or 3 or more.

(4) In the above-described embodiment, a pair of ribs were formed as blocking protrusions on only the first divided body, but the pair of ribs may also be formed on only the second divided body, or one rib may be formed on each of the first divided body and the second divided body.

(5) In the above-described embodiment, a pair of ribs were formed as positioning portions on only the first divided body, but the pair of ribs may also be formed on only the second divided body, or the pair of ribs may be formed on each of the first divided body and the second divided body. In this case, the ribs on the second divided body have a form that comes into contact with the outer circumference of the first divided body.

The invention claimed is:

1. A shield conduction path, comprising:
a wire; and
a pipe with a circular cross-section that accommodates the wire, wherein:
the pipe is formed by combining a first divided body and a second divided body that are divided in a diameter direction using, as boundaries, divided surfaces that extend in an axial direction of the pipe,
the first divided body and the second divided body include a metal material that can be held in a combined state through welding,
a circumferential length of the first divided body is set to be longer than a circumferential length of the second divided body,
the wire is stored in the first divided body,
the pipe is circular in cross section, and
a circumferential length of an outer curved surface of the first divided body is set to be longer that a circumferential length of an outer curved surface of the second divided body.

2. The shield conduction path according to claim 1, wherein the first divided body has a form in which a virtual plane connecting the divided surfaces intersects with none of a plurality of the wires in a state in which the plurality of wires are accommodated in the first divided body.

3. The shield conduction path according to claim 1, wherein a blocking protrusion with a form that protrudes in a circumferential direction from an edge on an inner circumferential side of the divided surface is formed on at least one of the first divided body and the second divided body.

4. The shield conduction path according to claim 3, wherein a surface of the blocking protrusion that faces an inner portion of the pipe is an arc-shaped surface.

5. The shield conduction path according to claim 3, wherein the blocking protrusion is formed on an inner circumferential surface of the at least one of the first divided body and the second divided body such that the blocking protrusion extends further diametrically inward than remaining parts of the at least one of the first divided body and the second divided boy.

6. The shield conduction path according to claim 3, wherein:
the blocking protrusion is formed on only the first divided body;
the blocking protrusion has a semi-circular shape in the cross section;
the divided surface of the first divided body is flat in the cross section; and
the blocking protrusion circumferentially extends in two circumferential directions from the edge on the inner circumferential side of the divided surface.

7. The shield conduction path according to claim 1, wherein on at least one of the first divided body and the second divided body, a pair of positioning portions that come into contact with a circumferential surface of the other divided body are formed.

8. The shield conduction path according to claim 1, wherein there is only one divided surface along the diameter direction at each circumferential end of the first divided body and the second divided body.

* * * * *